US007453110B2

(12) United States Patent
Hwang (10) Patent No.: US 7,453,110 B2
(45) Date of Patent: Nov. 18, 2008

(54) CMOS IMAGE SENSOR AND METHOD FOR MANUFACTURING THE SAME

(75) Inventor: Joon Hwang, Cheongju-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 82 days.

(21) Appl. No.: 11/615,143

(22) Filed: Dec. 22, 2006

(65) Prior Publication Data

US 2007/0145441 A1 Jun. 28, 2007

(30) Foreign Application Priority Data

Dec. 28, 2005 (KR) ............... 10-2005-0132690

(51) Int. Cl.
*H01L 31/113* (2006.01)

(52) U.S. Cl. .............. 257/291; 257/292; 257/294; 257/440; 257/E27.133

(58) Field of Classification Search .......... 257/291, 257/292, 432, 290, 440, 294, 225, 59, 72, 257/E27.131, E27.132, E27.128, E27.129, 257/E27.134, E27.135

See application file for complete search history.

(56) References Cited

U.S. PATENT DOCUMENTS 5,965,875 A * 10/1999 Merrill .................. 250/226
7,345,703 B2 * 3/2008 Lee ...................... 348/272

* cited by examiner

*Primary Examiner*—Minh-Loan Tran
*Assistant Examiner*—Selim Ahmed
(74) *Attorney, Agent, or Firm*—Saliwanchik, Lloyd & Saliwanchik

(57) ABSTRACT

Provided is a CMOS image sensor. The CMOS image sensor can include a semiconductor substrate, a blue photodiode region, a red photodiode region, a green photodiode region, an overcoat layer, and microlenses. The substrate can have a first photodiode region, a second photodiode region, and a transistor region. The blue photodiode region is formed having a predetermined depth in the first photodiode region. The red photodiode region is formed in the first photodiode region having a depth greater than that of the blue photodiode region with a gap separating the red photodiode region from the blue photodiode region. The green photodiode region is formed in the second photodiode region having a depth between the depths of the blue and red photodiode regions. The overcoat layer is formed on the semiconductor substrate, and microlenses are formed on the overcoat layer to correspond to the first and second photodiode regions.

7 Claims, 7 Drawing Sheets

FIG.7h

CMOS IMAGE SENSOR AND METHOD FOR MANUFACTURING THE SAME

RELATED APPLICATION(S)

This application claims priority under 35 U.S.C. §119(e) of Korean Patent Application No. 10-2005-0132690 filed Dec. 28, 2005, which is incorporated herein by reference in its entirety.

FIELD OF THE INVENTION

The present invention relates to a complementary metal oxide semiconductor (CMOS) image sensor.

BACKGROUND OF THE INVENTION

In general, an image sensor is a semiconductor device for converting an optical image into an electrical signal. The image sensor is roughly classified as a charge coupled device (CCD) or a CMOS image sensor (CIS).

The CCD includes a plurality of photodiodes (PDs) arranged in a matrix to convert light signal into an electrical signal. The CCD also includes a plurality of vertical charge coupled devices (VCCDs), a plurality of horizontal charged coupled devices (HCCDs), and a sense amplifier. The VCCDs are formed between the PDs vertically arranged in a matrix to transmit charge created from each of the PDs in a vertical direction. The HCCDs transmit the charge transmitted through each VCCD in a horizontal direction, and the sense amplifier senses the charge transmitted in the horizontal direction to output an electrical signal.

However, the CCD not only has a complicated driving method and high power consumption but also requires a plurality of photolithography processes.

Also, in the CCD, it is difficult to integrate a control circuit, a signal processing circuit, and an analog/digital converter (A/D converter) into a single CCD chip, so that the product is hard to miniaturize.

Recently, a CMOS image sensor (CIS) is in the limelight as a next generation image sensor for overcoming disadvantages of the CCD.

The CIS is a device that sequentially detects an output of each unit pixel using MOS transistors by forming the MOS transistors in each of the unit pixels on a semiconductor substrate using a CMOS technology that uses a control circuit and a signal processing circuit as peripheral circuits.

That is, the CIS provides photodiodes and MOS transistors within a unit pixel to sequentially detect an electrical signal of each unit pixel in a switching manner, and realize an image.

Since the CIS is manufactured using the CMOS technology, it has the advantages of relatively low power consumption and a simple manufacturing process using a relatively small number of photolithography processes.

Also, it is possible to integrate a control circuit, a signal processing circuit, and an A/D converter into a single CIS chip, so that a product can be easily miniaturized.

Therefore, CISs are widely used for various applications such as digital still cameras and digital video cameras.

CISs are classified as 3T type CMOS image sensors, 4T type CMOS image sensors, or 5T type CMOS image sensors depending on the number of transistors formed in each unit pixel. The 3T type CMOS image sensor includes one photodiode PD and three transistors. The 4T type CMOS image sensor includes one PD and four transistors.

A conventional 4T type CIS will be described below.

Figure 1:
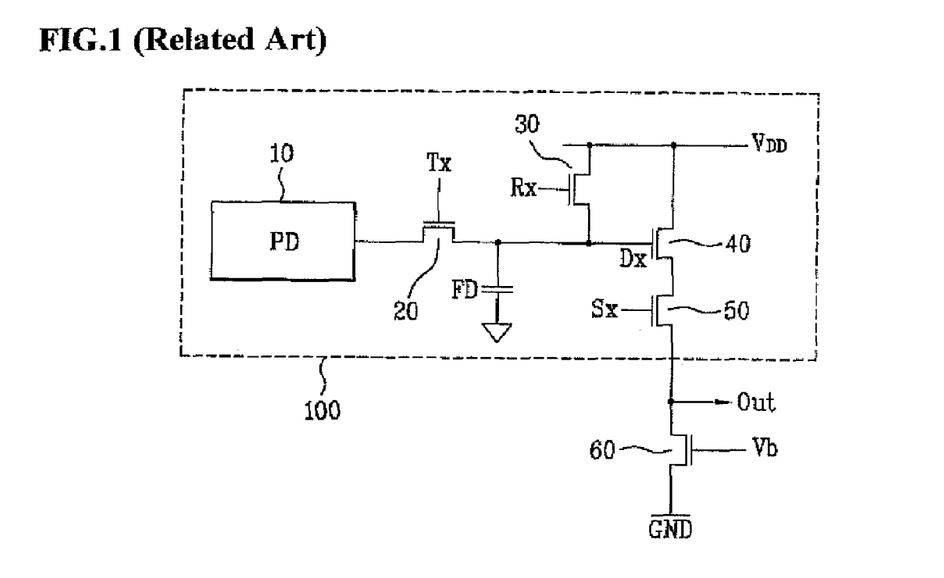
FIG. 1 is an equivalent circuit diagram of a general 4T type CIS.
Figure 2:
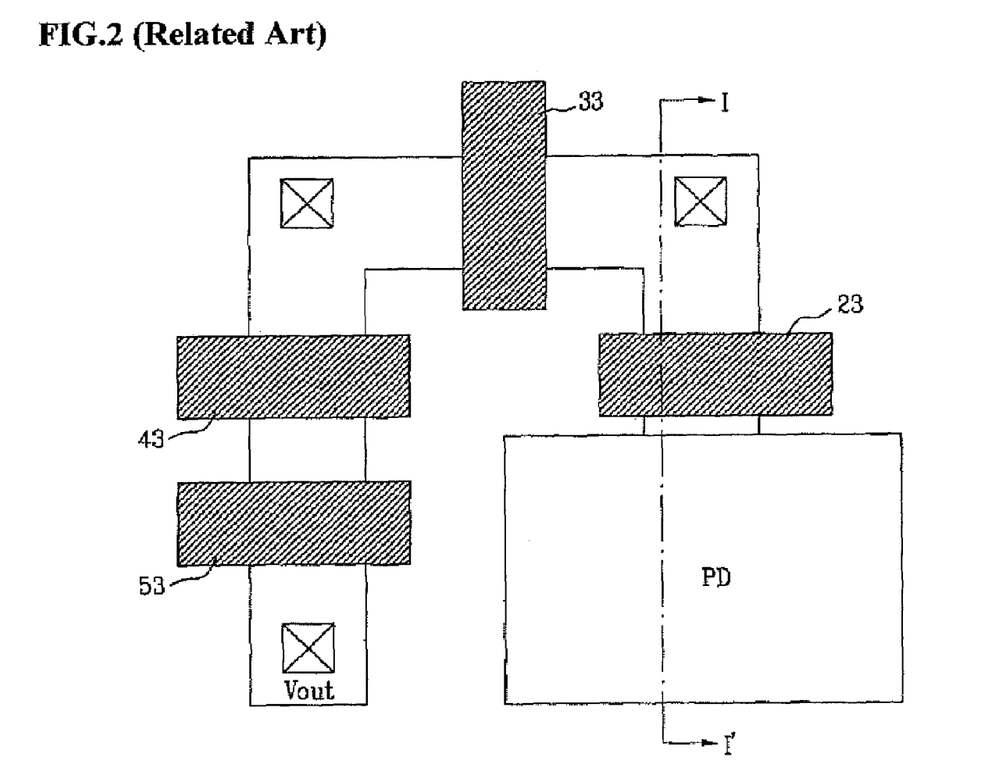
FIG. 2 is a lay-out diagram illustrating a unit pixel of a general 4T type CIS.

FIG. 1 is an equivalent circuit diagram of a general 4T type CIS, and FIG. 2 is a lay-out diagram illustrating a unit pixel of a general 4T type CIS.

Referring to FIG. 1, a unit pixel 100 of the 4T type CIS includes a PD 10 as a photo-electric converting part, and four transistors.

The four transistors 20, 30, 40, and 50 are transfer, reset, drive, and select transistors, respectively. In addition, a load transistor 60 is electrically connected to an output end of the pixel 100.

In FIG. 1, FD is a floating diffusion, Tx is the gate voltage of the transfer transistor 20, Rx is the gate voltage of the reset transistor 30, Dx is the gate voltage of the drive transistor 40, and Sx is the gate voltage of the select transistor 50.

Referring to FIG. 2, an active region is defined in a unit pixel of the general 4T type CIS. A device isolation layer is formed on a portion of the substrate to define the active region. A PD is formed in a portion of the active region that has a wide width, and gate electrodes 23, 33, 43, and 53 of four transistors are formed overlapping the remaining portion of the active region.

That is, the transfer, reset, drive, and select transistors 20, 30, 40, and 50 are formed by the gate electrode 23, 33, 43, and 53, respectively.

Here, source/drain regions of the transistors 20, 30, 40, and 50 are formed by implanting impurity ions into portions of the active region around the gate electrodes 23, 33, 43, and 53.

Figure 3:
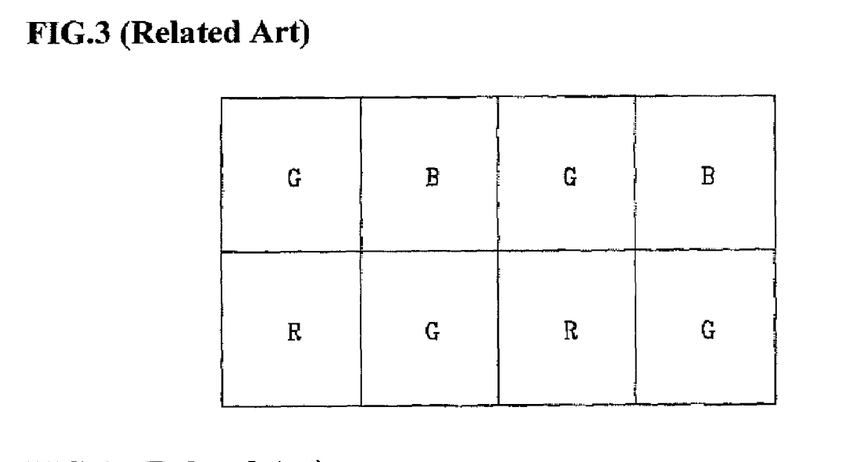
FIG. 3 is a plan view illustrating a Bayer pattern of general color filters.

FIG. 3 is a plan view illustrating a Bayer pattern of general color filters.

Referring to FIG. 3, color filters are arranged in an order of green (G), blue (B), C, and B on a first row. Also, color filters are arranged in an order of red (R), G, R, and G on a second row to correspond to the first row.

That is, Cs are arranged in a W-shape, Bs are arranged inside a V-shape of the W-shape, and Rs are arranged outside the V-shape of the W-shape.

FIGS. 4A to 4G are cross-sectional views, taken along a line I-I' of FIG. 2, explaining a method for manufacturing a CIS according to a related art.

Figure 4A:
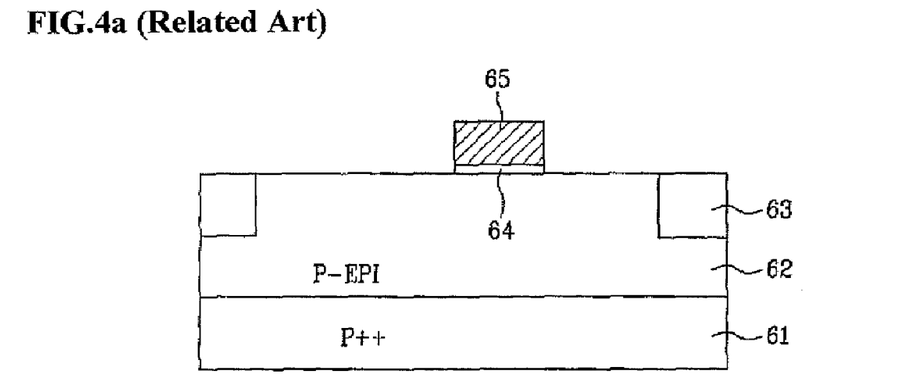
FIGS. 4A to 4G are cross-sectional views, taken along a line I-I' of FIG. 2, explaining a method for manufacturing a CIS according to a related art.

Referring to FIG. 4A, an epitaxial process is performed on a high concentration $P^{++}$-type semiconductor substrate 61 to form a low concentration P-type epitaxial layer 62.

Subsequently, an active region and a device isolation region are defined in the semiconductor substrate 61. A device isolation layer 63 is formed in the device isolation region using a shallow trench isolation (STI) process or a local oxidation of silicon (LOCOS) process.

Also, a gate insulating layer 64 and a conductive layer (e.g., a high concentration polysilicon layer) are sequentially deposited on an entire surface of the epitaxial layer 62 in which the device isolation layer 63 has been formed. The conductive layer and the gate insulating layer are selectively removed to form a gate electrode 65.

Figure 4B:
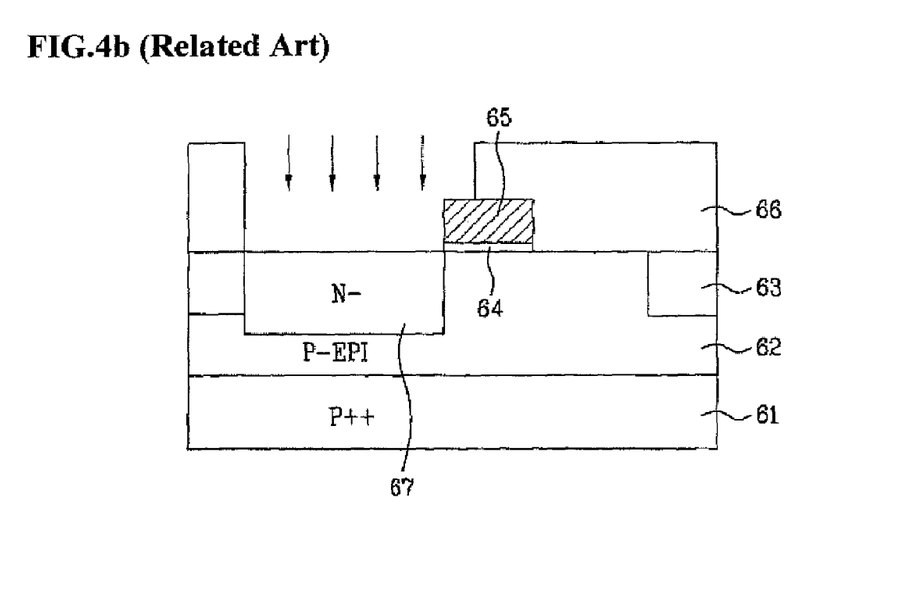

Referring to FIG. 4B, a first photoresist layer 65 is coated on an entire surface of the semiconductor substrate 61, and patterned to expose respective PD regions of Bs, Gs, and Rs using exposure and development processes.

Also, blue, green, and red PD regions 67 are formed by implanting low concentration $n^-$-type impurity ions into the epitaxial layer 62 using the patterned first photoresist layer 66 as a mask.

Each PD region 67 serves as a source region of the reset transistor (Rx of FIGS. 1 and 2).

When a reverse bias is applied between each PD region 67 and the low concentration P-type epitaxial layer 62, a depletion layer is created. Electrons created by receiving light from the PD region reduce a potential of the drive transistor when the reset transistor is turned off. The electrons reduce the potential constantly from a point when the reset transistor is turned off after being turned on, so that a voltage difference is generated. This voltage difference is used for processing a signal and thus operates an image sensor.

Here, the PD regions 67 are formed to have the same depth of about 2-3 μm.

That is, the PD regions 67 are formed to each have the same depth by implanting impurity ions using the same ion implantation energy.

Figure 4C:
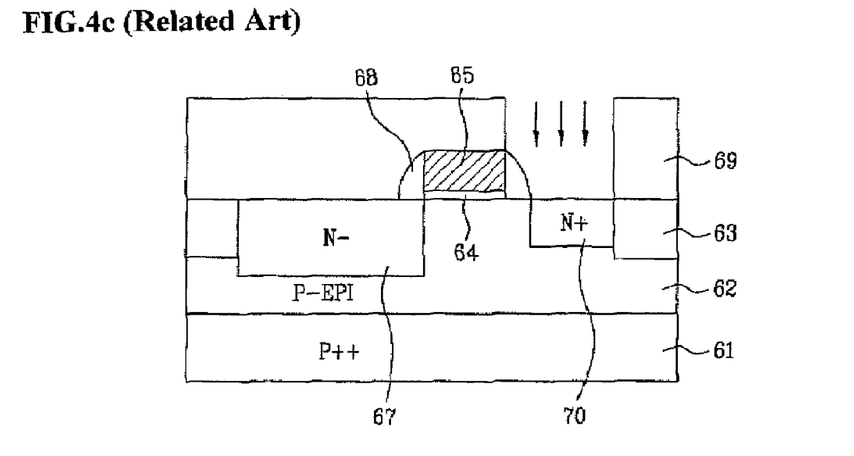

Referring to FIG. 4C, a sidewall insulating layer 68 is formed on side portions of the gate electrode 65 by completely removing the first photoresist layer 66, depositing an insulating layer on an entire surface of the semiconductor substrate 61, and performing an etch-back process on the insulating layer.

Subsequently, a second photoresist layer 69 is coated on an entire surface of the semiconductor substrate 61, and patterned to cover the PD region and expose source/drain regions of the transistors using exposure and development processes.

Also, an $n^+$-type diffusion region 70 is formed by implanting high concentration $n^+$-type impurity ions in the exposed source/drain regions using the patterned second photoresist layer 69 as a mask.

Figure 4D:
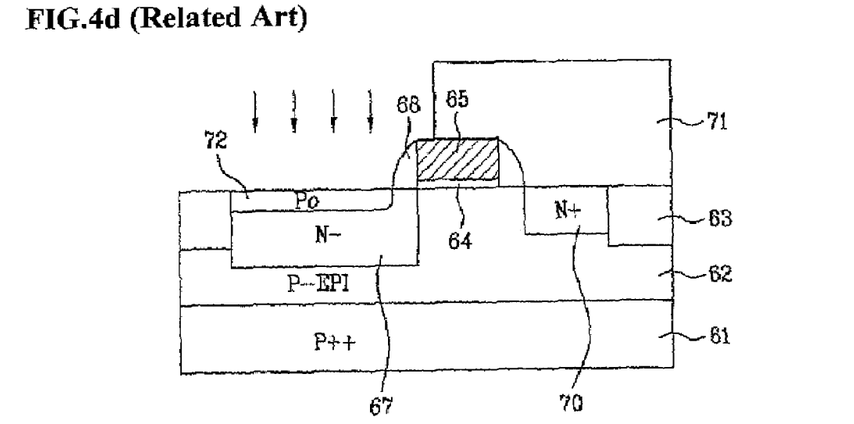

Referring to FIG. 4D, the second photoresist layer 69 is removed, a third photoresist layer 71 is coated on an entire surface of the semiconductor substrate 61 and patterned to expose respective PD regions using exposure and development processes.

Subsequently, a $p^0$-type diffusion region 72 is formed within a surface of the semiconductor substrate by implanting $p^0$-type impurity ions into the PD region 67 in which the $n^-$-type diffusion region has been formed using the patterned third photoresist layer 71 as a mask.

Here, the $p^0$-type diffusion region 72 is formed to a depth of 0.1 μm or less.

Figure 4E:
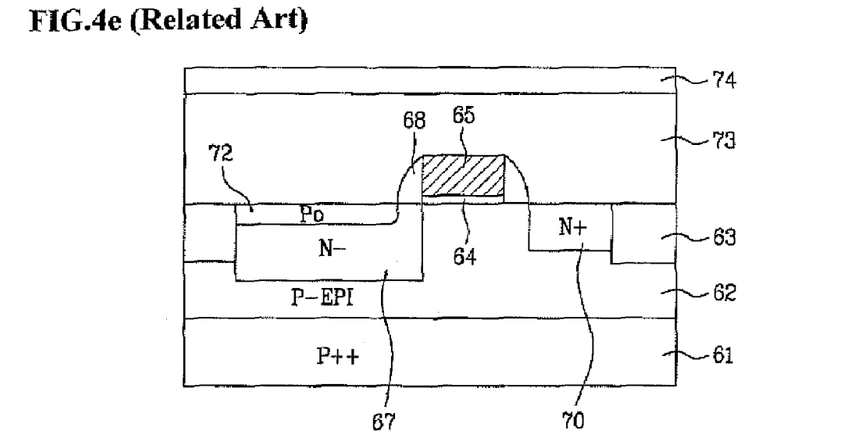

Referring to FIG. 4E, the third photoresist layer 71 is removed, and a heat treatment process is performed on the semiconductor substrate 61 to diffuse respective impurity diffusion regions.

Subsequently, an interlayer insulating layer 73 is formed on an entire surface of the semiconductor substrate 61. A variety of metal lines (not shown) are formed by depositing a metal layer on the interlayer insulating layer 73 and selectively patterning the metal layer.

The interlayer insulating layer 73 and the metal lines can be formed in a plurality of layers.

A first overcoat layer 74 is formed on the interlayer insulating layer 73.

Figure 4F:
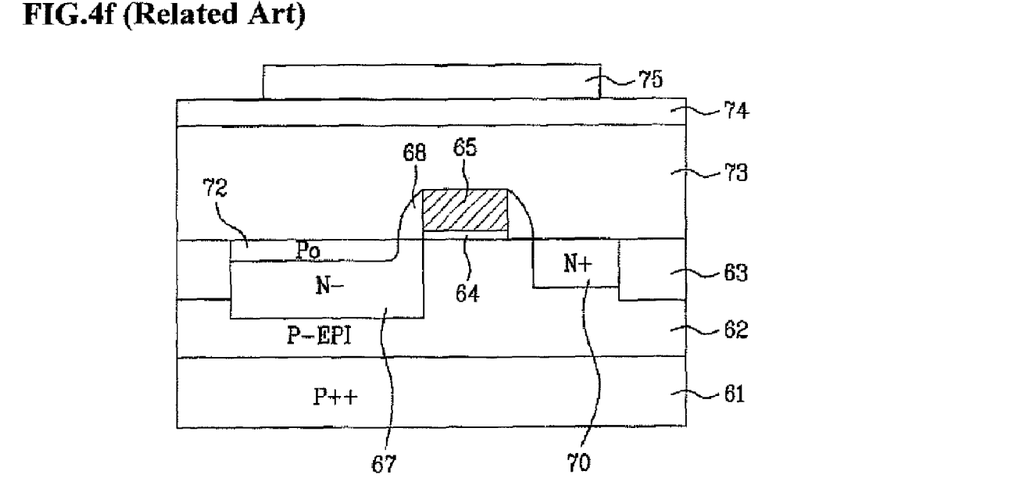

Referring to FIG. 4F, a color filter layer 75 including color filters is formed by coating blue, red, and green resist layers on the first overcoat layer 74, and performing exposure and development processes on the resist layers. The color filters of the color filter layer filter light for respective wavelength bands.

At this point, since the respective color filters are formed by different photolithography processes, they have different height differences, respectively.

Figure 4G:
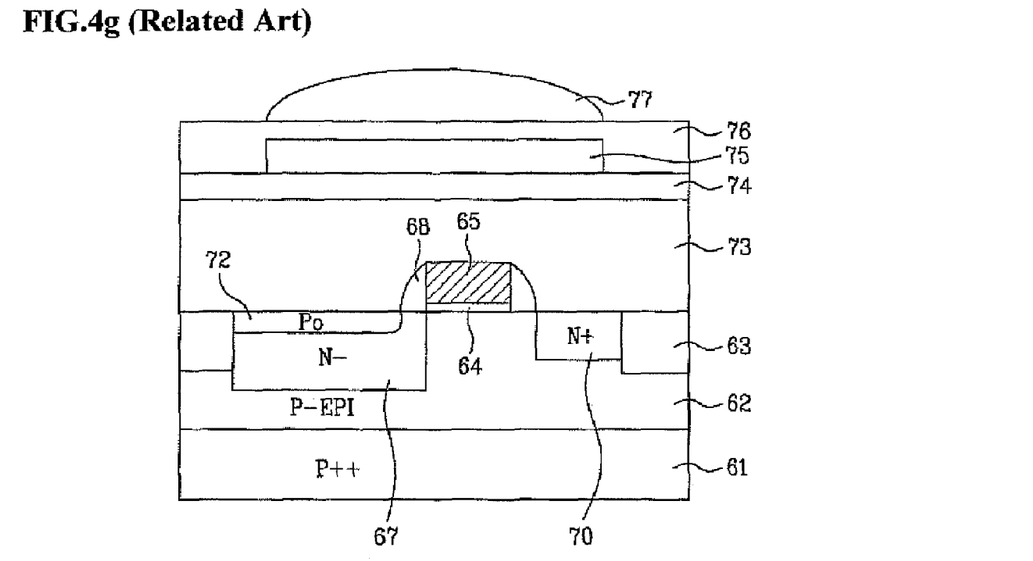

Referring to FIG. 4G, a second overcoat layer 76 is formed on an entire surface of the semiconductor substrate 61 including the color filter layer 75 on which a planarization has been performed. After that, a material layer for forming a microlens is coated on the second overcoat layer 76, and patterned to form microlens patterns using exposure and development processes.

Subsequently, microlenses 77 are formed by performing a reflow process on the microlens patterns.

However, the above-described method for manufacturing a CIS according to the related art has the following problems.

That is, since PDs of blue, green, and red colors, which are primary colors, are formed to have the same depth. The primary colors have serious differences in penetrating depth from a surface of a silicon substrate to PDs corresponding to R, B, and G because of a difference in their wavelength in association with a lattice structure of silicon. Particularly, the PDs do not function effectively with respect to blue and red pixels, which reduces characteristics of the image sensor.

BRIEF SUMMARY

Accordingly, embodiments of the present invention are directed to a CIS and a method for manufacturing the same that substantially obviates one or more problems due to limitations and disadvantages of the related art.

An object of the present invention is to provide a CIS and a method for manufacturing the same, capable of improving characteristics of the image sensor by forming photodiodes with consideration of a difference in a penetration depth of a silicon lattice structure caused by a wavelength difference of primary colors.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a complementary metal oxide semiconductor image sensor including: a semiconductor substrate having a first photodiode region, a second photodiode region, and a transistor region defined thereon; a blue photodiode region formed to a predetermined depth in the first photodiode region; a red photodiode region formed in the first photodiode region to a depth greater than that of the blue photodiode region with a predetermined gap separating the red photodiode region from the blue photodiode region; a green photodiode region formed in the second photodiode region to a depth between the depth of the blue photodiode region and the depth of the red photodiode region; an overcoat layer formed on an entire surface of the semiconductor substrate; and microlenses formed on the overcoat layer to correspond to the first and second photodiode regions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the preferred embodiments of the present invention, examples of which are illustrated in the accompanying drawings.

Figure 5:
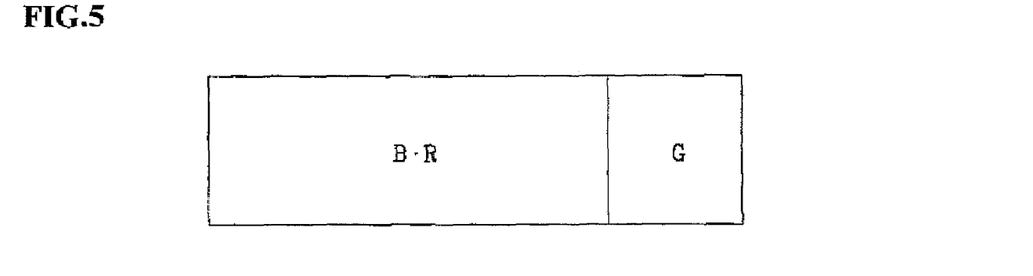
FIG. 5 is a plan view illustrating a Bayer pattern of color filters in a CIS according to the present invention

FIG. 5 is a plan view illustrating a Bayer pattern of color filters in a CIS according to an embodiment of the present invention.

Referring to FIG. 5, the CIS provides a Bayer pattern by allowing a blue pixel and a red pixel to share a region with each other, and forming the blue and red pixel larger than a green pixel.

That is, a PD region of one pixel is shared for blue and red colors by allowing the PD region to have two different depths.

Figure 6:
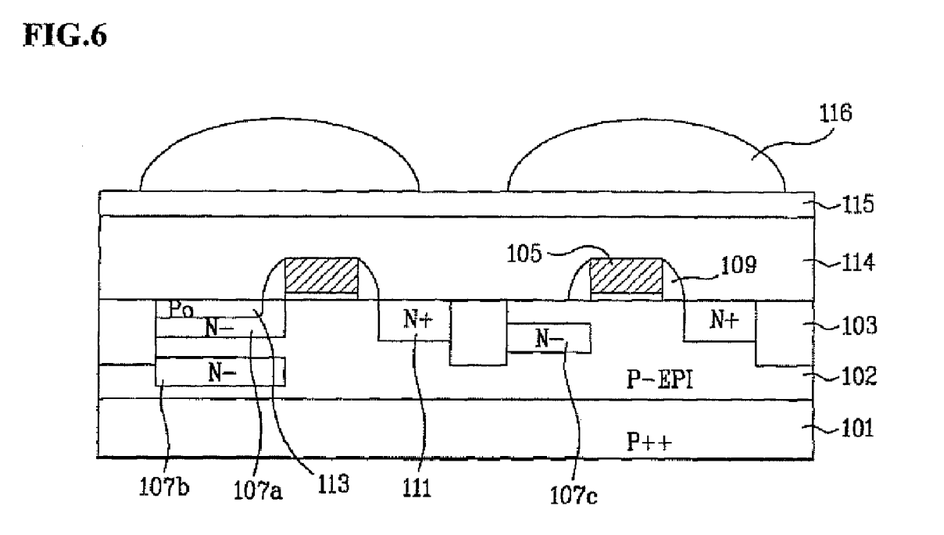
FIG. 6 is a cross-sectional view of a CIS according to an embodiment of the present invention.

FIG. 6 is a cross-sectional view of a CIS according to an embodiment of the present invention.

Referring to FIG. 6, the CIS can include: a first conductive type ($P^-$-type) epitaxial layer 102 formed on a surface of a first conductive type ($P^{++}$-type) semiconductor substrate 101; a device isolation layer 103 formed in a device isolation region of the semiconductor substrate 101; a gate electrode 105 formed on an active region of the semiconductor substrate 101 with a gate insulating layer 104 interposed therebetween; a second conductive type ($n^-$-type) blue PD region 107a formed to have a depth of about 0.3-0.5 μm from a surface of the epitaxial layer 102 at one side of the gate electrode 105; a second conductive type ($n^-$-type) red PD region 107b formed to have a depth of about 4.0-5.0 μm greater than the depth of the blue PD region 107a in a portion of the epitaxial layer 102 where the blue PD region 107a has been formed; a second conductive type ($n^-$-type) green PD region 107c formed to have a depth of about 1.5-3.0 μm from a surface of the epitaxial layer 102; a first conductive type ($P^0$-type) impurity region 113 formed to have a depth of 0.1 μm or less from a surface of the blue PD region 107a; an insulation layer sidewall 109 formed at side portions of the gate electrode 105; a second conductive type ($n^+$-type) impurity region 111 formed in a surface of the epitaxial layer 102 at a second side of the gate electrode 105; an interlayer insulating layer 114 and an overcoat layer 115 sequentially formed on an entire surface of the semiconductor substrate 101; and microlenses 116 formed on the overcoat layer 115 to correspond to the blue and red PD regions 107a and 107b, and the green PD region 107c.

In one embodiment, the epitaxial layer 102 can have a thickness of 4-7 μm.

FIGS. 7A to 7H are cross-sectional views explaining a method for manufacturing a CIS according to an embodiment of the present invention.

Figure 7A:
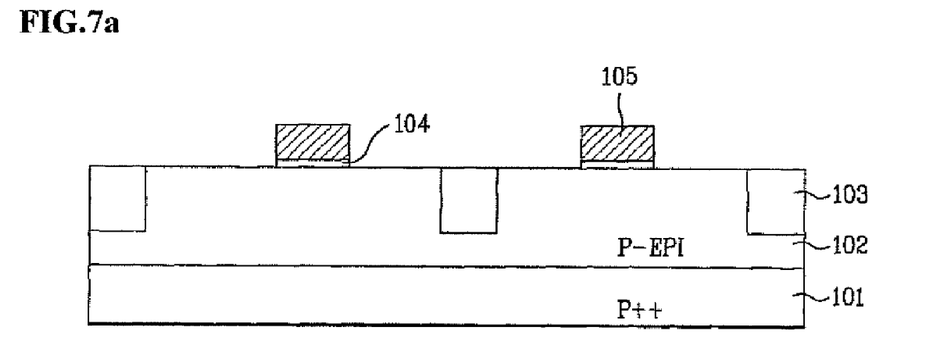
FIGS. 7A to 7H are cross-sectional views explaining a method for manufacturing a CIS according to an embodiment of the present invention.

Referring to FIG. 7A, a low concentration first conduction type ($P^-$-type) epitaxial layer 102 can be formed on a high concentration ($P^{++}$-type) single crystal silicon semiconductor substrate 101.

Here, the epitaxial layer 102 is intended for forming a large and deep depletion region in a photodiode to increase an ability of a low voltage photodiode for collecting light charges, and to improve light sensitivity.

In another embodiment, the semiconductor substrate 101 can include a p-type epitaxial layer formed on an n-type substrate.

In a specific embodiment the $p^-$-type epitaxial layer 102 can be formed to have a thickness of 4-7 μm.

Subsequently, for isolation between devices, a device isolation layer 103 can be formed in the semiconductor substrate 101 where the epitaxial layer 102 has been formed.

Though not shown, one method for forming the device isolation layer 103 is described below.

First, a pad oxide layer a pad nitride layer, and a tetra ethyl ortho silicate (TEOS) oxide layer are sequentially formed on the semiconductor substrate. A photoresist layer is formed on the TEOS oxide layer.

Subsequently, the photoresist layer is patterned by performing exposure and development processes using a mask defining an active region and a device isolation region. At this point, a portion of the photoresist layer that is located on the device isolation region is removed.

Also, portions of the pad oxide layer, the pad nitride layer, and the TEOS oxide layer that are located on the device isolation region are selectively removed using the patterned photoresist layer as a mask.

Subsequently, a portion of the semiconductor substrate that is located in the device isolation region is etched to a predetermined depth using the patterned pad oxide layer, pad nitride layer, and TEOS oxide layer as a mask to form a trench. Also, the photoresist layer is completely removed.

Subsequently, a sacrifice oxide layer is formed to have a shallow thickness on an entire surface of the substrate in which the trench has been formed. An $O_3$ TEOS layer is formed on the substrate to fill the trench. At this point, the sacrifice oxide layer is formed also on an inner wall of the trench, and the forming of the $O_3$ TEOS layer is performed at a temperature of about 1000° C. or more.

Subsequently, chemical mechanical polishing (CMP) is performed on an entire surface of the semiconductor substrate to remove the $O_3$ TEOS layer such that the $O_3$ TEOS layer is left only in the trench, so that the device isolation layer 103 is formed inside the trench. Subsequently, the pad oxide layer, the pad nitride layer, and the TEOS oxide layer are removed.

Referring back to FIG. 7A, a gate insulating layer 104, and a conductive layer (e.g., a high concentration polysilicon layer) can be sequentially deposited on an entire surface of the epitaxial layer 102 in which the device isolation layer 103 has been formed In an embodiment, the gate insulating layer 104 can be formed using thermal oxidation or chemical vapor deposition (CVD).

Then, the conductive layer and the gate insulating layer 104 can be selectively removed to form a gate electrode 105.

Figure 7B:
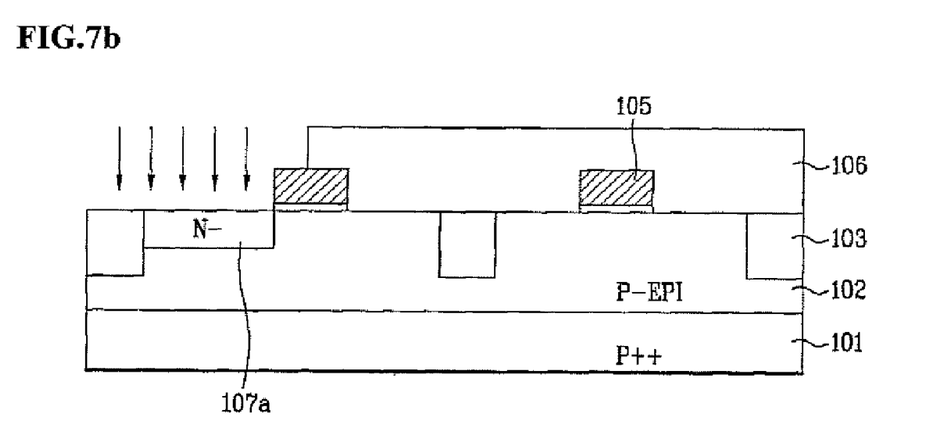

Referring to FIG. 7B, a first photoresist layer 106 can be coated on an entire surface of the semiconductor substrate 101 and patterned using exposure and development process to expose a region for a blue PD region and a red PD region.

The blue PD region 107a can be formed by implanting low concentration second conductive type ($n^-$-type) impurity ions into the epitaxial layer 102 using the patterned first photoresist layer 106 as a mask.

In a specific embodiment, the blue PD region 107a is formed to have a depth of about 0.3-0.5 μm from a surface of the semiconductor substrate 101.

Figure 7C:
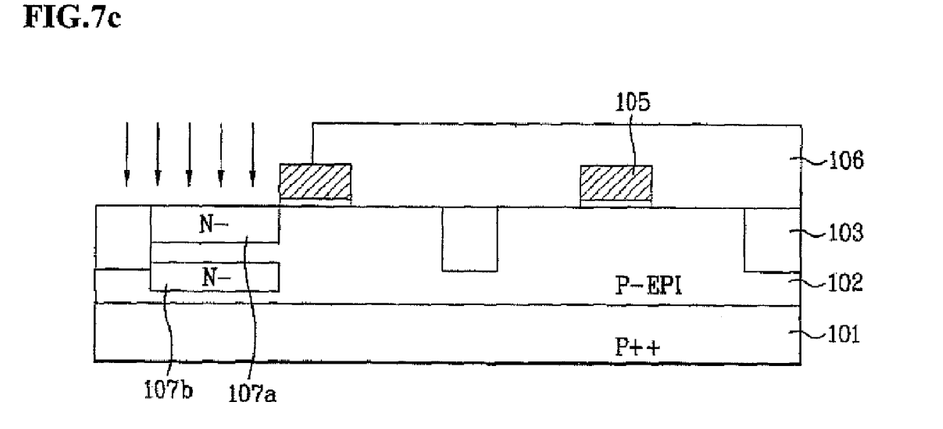

Referring to FIG. 7C, the red PD region 107b can be formed by implanting low concentration second conductive type (n⁻-type) impurity ions into the epitaxial layer 102 using the patterned first photoresist layer 106 as a mask.

In a specific embodiment the red PD region 107b is formed to have a depth of about 4-5 μm from a surface of the semiconductor substrate 101.

Accordingly, the blue and red PD regions 107a and 107b can be formed using the same mask and different ion implantation energy.

Also, in an embodiment the red PD region 107b can be formed first, and the blue PD region 107a can be formed using lower ion implantation energy.

Figure 7D:
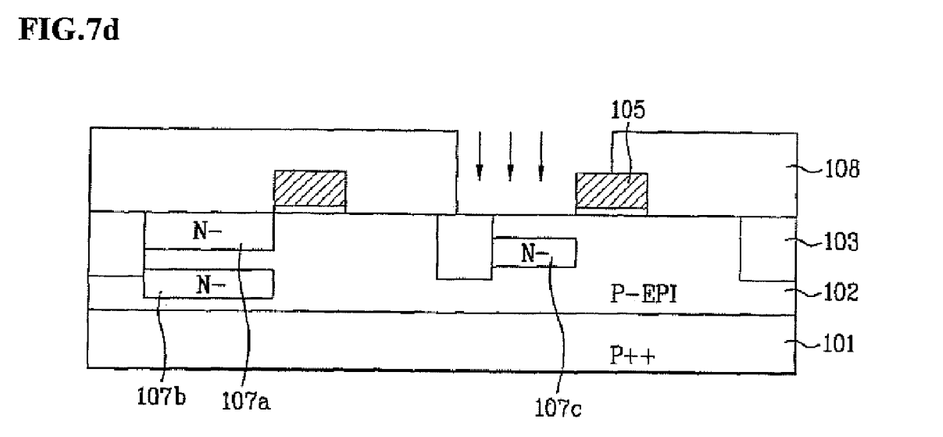

Referring to FIG. 7D, after the first photoresist layer 106 is completely removed, a second photoresist layer 108 can be coated on an entire surface of the semiconductor substrate 101 and patterned using exposure and development processes to expose a green PD region.

Then, the green PD region 107c can be formed by implanting low concentration second conductive type (n⁻-type) impurity ions into the epitaxial layer 102 using the patterned second photoresist layer 108 as a mask.

In a specific embodiment, the green PD region 107c is formed to have a depth of about 1.5-3.0 μm from a surface of the semiconductor substrate 101.

Meanwhile, the distance between the green PD region 107c and the surface of semiconductor substrate 101 can be formed to be of 0.5-1.0 μm by controlling ion implantation energy.

Figure 7E:
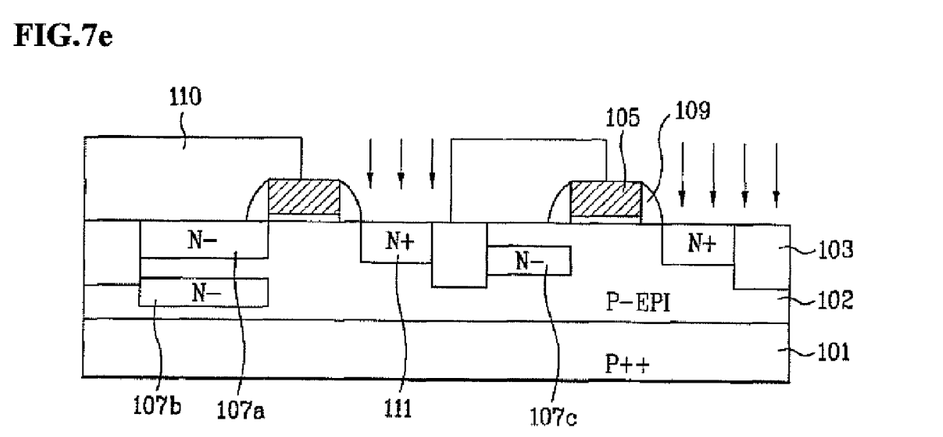

Referring to FIG. 7E, after the second photoresist 108 is completely removed, an insulating layer can be deposited on an entire surface of the semiconductor substrate 101. Then, an etch-back process can be performed to form a sidewall insulating layer on both side portions of the gate electrode 105.

Subsequently, a third photoresist layer 110 can be coated on an entire surface of the semiconductor substrate 101. The third photoresist layer 110 can be patterned using exposure and development processes to cover the respective PD regions and expose source/drain regions of respective transistors.

Then, an n⁺-type diffusion region 111 can be formed by implanting high concentration n⁺-type impurity ions into the exposed source/drain regions using the patterned third photoresist 110 as a mask.

Figure 7F:
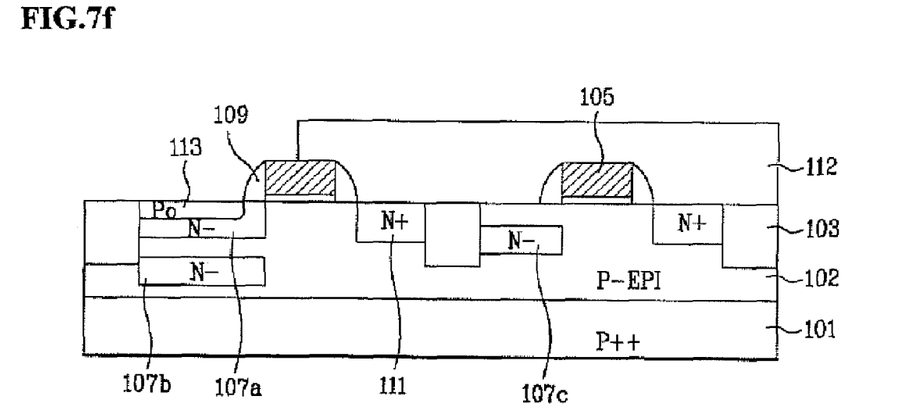

Referring to FIG. 7F, after the third photoresist layer 110 is removed, a fourth photoresist layer 112 can be coated on an entire surface of the semiconductor substrate 101 and patterned using exposure and development processes to expose the blue PD region 107a.

Subsequently, a p⁰-type diffusion region 113 can be formed in a surface of the epitaxial layer 102 by implanting a first conduction type (p⁰-type) impurity ions into the epitaxial layer 102 in which the blue PD region 107a has been formed using the patterned fourth photoresist layer 112 as a mask.

In a specific embodiment, the first p⁰-type diffusion region 113 is formed to have a depth of 0.1 μm or less.

Figure 7G:
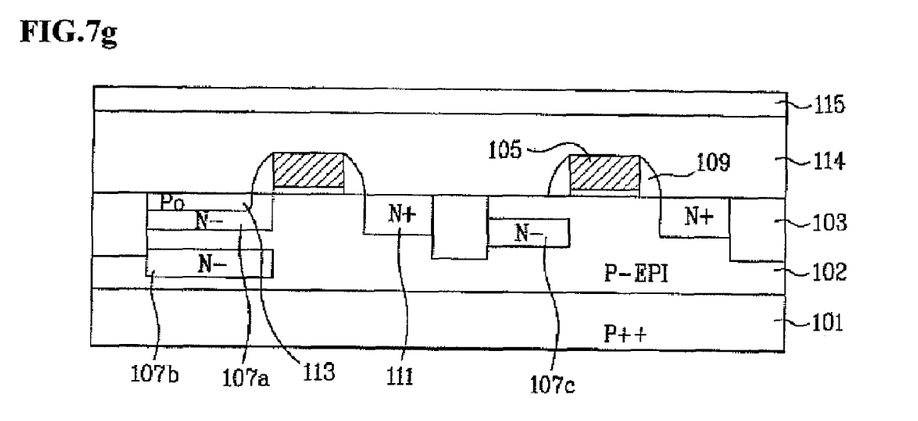

Referring to FIG. 7G, the fourth photoresist layer 112 can be removed and a heat treatment process can be performed on the semiconductor substrate to diffuse respective impurity diffusion regions.

Subsequently, an interlayer insulating layer 114 can be formed on an entire surface of the semiconductor substrate 101. A variety of metal lines (not shown) can be formed by, for example, depositing a metal layer on the interlayer insulating layer 114 and selectively patterning the metal layer.

The interlayer insulating layer 114 and the metal lines can be formed in a plurality of layers.

Then, an overcoat layer 115 can be formed on the interlayer insulating layer 114.

Figure 7H:
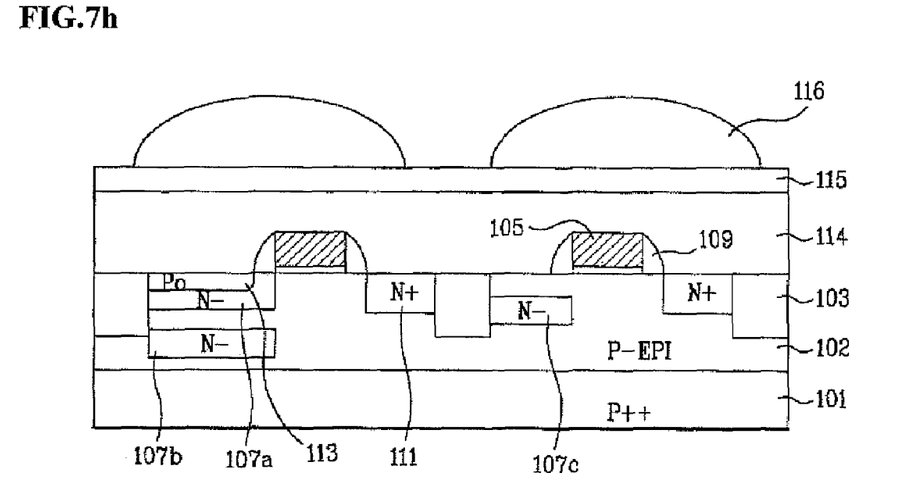

Referring to FIG. 7H, a material layer for forming a microlens can be coated on the overcoat layer 115, and patterned to form microlens patterns using exposure and development processes.

Subsequently, the microlenses can be formed by performing a reflow process on the microlens patterns at a temperature range of 150-200° C.

That is, the microlens patterns can be formed by coating the material layer for forming a microlens on the overcoat layer 116, and patterning the material layer using the exposure and development processes.

The material layer for forming a microlens can be a resist or an oxide layer such as TEOS.

Here, the reflow process can be performed using a hot plate or a furnace. At this point, a curvature of the microlens 116 changes depending on a contracting and heating method. A microlens has a different condensing efficiency depending on the curvature.

Subsequently, the microlens 116 can be cured by illuminating ultraviolet rays thereon. Here, the microlens 116 can maintain an optimum curvature radius by illuminating ultraviolet light onto the microlens 116 and curing the same.

As described above, a CIS and a method for manufacturing the same have the following effects.

That is, high potential wells are formed only in predetermined regions with consideration of the fact that light in blue, green, and red wavelengths have different penetration depths of a semiconductor substrate. Accordingly, a process of forming a separate color filter is not required by allowing photo electrons to be generated by relevant light energy. Therefore, process simplification and cost reduction are achieved. Also, it is possible to prevent a light absorption rate from reducing while light energy passes through a color filter layer, so that light sensitivity can improve.

It will be apparent to those skilled in the art that various modifications and variations can be made in the present invention. Thus, it is intended that the present invention covers the modifications and variations of the invention provided they come within the scope of the appended claims and their equivalents.

I claim:

1. A complementary metal oxide semiconductor (CMOS) image sensor, comprising:
    a semiconductor substrate having a first photodiode region, a second photodiode region, and a transistor region;
    a blue photodiode region formed having a predetermined depth in the first photodiode region;
    a red photodiode region formed having a depth greater than that of the blue photodiode region in the first photodiode region, wherein a predetermined gap separates the red photodiode region from the blue photodiode region;
    a green photodiode region formed in the second photodiode region to a depth between the depth of the blue photodiode region and the depth of the red photodiode region;
    an overcoat layer formed on an entire surface of the semiconductor substrate; and
    microlenses formed on the overcoat layer corresponding to the first and second photodiode regions.

2. The CMOS image sensor according to claim 1, wherein the blue photodiode region has a depth of 0.3-0.5 μm.

3. The CMOS image sensor according to claim 1, wherein the red photodiode region has a depth of 4-5 μm.

4. The CMOS image sensor according to claim 1, wherein the green photodiode region has a depth of 1.5-3.0 μm.

5. The CMOS image sensor according to claim 1, further comprising an impurity region having a conductivity type opposite to that of the blue photodiode region, and formed in a surface of the semiconductor substrate in which the blue photodiode region is formed.

6. The CMOS image sensor according to claim 5, wherein the impurity region has a depth of 0.1 μm or less.

7. The CMOS image sensor according to claim 1, wherein the green photodiode region is formed 0.5-1.0 μm from a surface of the semiconductor substrate.

* * * * *